(12) United States Patent
Yoon et al.

(10) Patent No.: US 9,377,641 B2
(45) Date of Patent: Jun. 28, 2016

(54) TAPE PACKAGE AND DISPLAY PANEL MODULE HAVING THE SAME

(71) Applicant: Samsung Display Co., Ltd., Yongin, Gyeonggi-Do (KR)

(72) Inventors: Il-Hwan Yoon, Asan-si (KR); Seung-Chang Woo, Asan-si (KR)

(73) Assignee: Samsung Display Co., Ltd. (KR)

( * ) Notice: Subject to any disclaimer, the term of this patent is extended or adjusted under 35 U.S.C. 154(b) by 37 days.

(21) Appl. No.: 14/257,612

(22) Filed: Apr. 21, 2014

(65) Prior Publication Data

US 2015/0055077 A1 Feb. 26, 2015

(30) Foreign Application Priority Data

Aug. 20, 2013 (KR) ........................ 10-2013-0098702

(51) Int. Cl.
| | | |
|---|---|---|
| *G02F 1/1345* | (2006.01) | |
| *G02F 1/1333* | (2006.01) | |
| *H05K 1/02* | (2006.01) | |
| *H05K 1/14* | (2006.01) | |
| *H05K 1/18* | (2006.01) | |

(52) U.S. Cl.
CPC ........ *G02F 1/133305* (2013.01); *H05K 1/0281* (2013.01); *G02F 1/13452* (2013.01); *H05K 1/147* (2013.01); *H05K 1/189* (2013.01); *H05K 2201/09045* (2013.01); *H05K 2201/09781* (2013.01); *H05K 2201/10136* (2013.01); *H05K 2201/10681* (2013.01)

(58) Field of Classification Search
CPC ................ G02F 1/133305; H05K 2201/10136
See application file for complete search history.

(56) References Cited

U.S. PATENT DOCUMENTS

| | | | |
|---|---|---|---|
| 8,071,884 B2 | 12/2011 | Wang et al. | |
| 2005/0183884 A1* | 8/2005 | Su | .................................. 174/257 |
| 2007/0182911 A1 | 8/2007 | Cha | |
| 2008/0002131 A1 | 1/2008 | Koh | |
| 2009/0020858 A1 | 1/2009 | Kozaka et al. | |

FOREIGN PATENT DOCUMENTS

| | | |
|---|---|---|
| JP | 08-162776 A | 6/1996 |
| JP | 2000-058998 A | 2/2000 |
| JP | 2002-050833 A | 2/2002 |
| JP | 2009-016578 A | 1/2009 |
| KR | 100618898 B1 | 8/2006 |
| KR | 1020060126174 A | 12/2006 |

* cited by examiner

*Primary Examiner* — James Dudek
(74) *Attorney, Agent, or Firm* — Innovation Counsel LLP

(57) ABSTRACT

A tape package includes a body portion including a flexible material, a driving circuit disposed on the body portion, a first sub-connection portion extending from the body portion in a first direction, a first main-connection portion extending from the first sub-connection portion in the first direction, a first lead line including a first end electrically connected to the driving circuit and a second end extending in the first direction, the first end being opposite to the second end and a protrusion extending from the first sub-connection portion in a third direction perpendicular to the first direction on a same plane with the first sub-connection portion. Accordingly, a crack of the lead line may be reduced or effectively prevented.

20 Claims, 7 Drawing Sheets

TAPE PACKAGE AND DISPLAY PANEL MODULE HAVING THE SAME

PRIORITY STATEMENT

This application claims priority under 35 U.S.C. §119 to Korean Patent Application No. 10-2013-0098702, filed on Aug. 20, 2013 in the Korean Intellectual Property Office KIPO, the contents of which are herein incorporated by reference in their entireties.

BACKGROUND

1. Field

Example embodiments relate to a tape package and a display panel module having the tape package. More particularly, example embodiments relate to a tape package with an improved reliability and a display panel module having the tape package.

2. Description of the Related Art

A flat panel display ("FPD") may be used as a display apparatus. The flat panel display may be a large, thin and/or lightweight display device. Examples of the flat panel display include, but are not limited to, a liquid crystal display ("LCD"), a plasma display panel ("PDP") and an organic light emitting display ("OLED").

A display panel of the display apparatus is electrically connected with a data driving part, a gate driving part and an external driving part. The external driving part is electrically connected with the display panel by a flexible tape package to thereby reduce size and weight of the display apparatus.

The tape package includes a circuit pattern disposed on the flexible tape package. The tape package further includes a driving circuit such as an IC chip.

The tape package has flexibility, so that the tape package may be bent while the tape package is assembled with a display panel module. However, the circuit pattern of the tape package may be undesirably cracked or damaged while the display panel module is manufactured or used.

SUMMARY

Example embodiments provide a tape package capable of reducing a crack of the lead line.

Example embodiments also provide a display panel module having the tape package.

According to example embodiments, a tape package includes a body portion including a flexible material, a driving circuit disposed on the body portion, a first sub-connection portion extending from the body portion in a first direction, a first main-connection portion extending from the first sub-connection portion in the first direction, a first lead line including a first end electrically connected to the driving circuit and a second end extending in the first direction, the first end being opposite to the second end and a protrusion extending from the first sub-connection portion in a third direction perpendicular to the first direction on a same plane with the first sub-connection portion.

In example embodiments, the protrusion has a rectangle shape.

In example embodiments, the protrusion has a curved shape.

In example embodiments, the protrusion includes a metallic support layer on the protrusion.

In example embodiments, the metallic support layer includes a same material with the first lead line.

In example embodiments, the tape package further includes a protection layer covering a portion of the first lead line.

In example embodiments, the tape package further includes a sealing material securing the driving circuit to the body portion and covering a side surface of the driving circuit.

In example embodiments, the first lead line includes a first main-lead line disposed on the first main-connection portion and a first sub-lead line disposed on the first sub-connection portion, where a width of the first sub-lead line in the third direction is greater than a width of the first main-lead line in the third direction.

In example embodiments, corners in the first direction of the first main-connection portion are curved.

In example embodiments, the protrusion extends from the first main-connection portion and the first sub-connection portion in the third direction, and the protrusion has a curved shape.

In example embodiments, the tape package further includes a second sub-connection portion extending from the body portion in a second direction opposite to the first direction, and a second main-connection portion extending from the second sub-connection portion in the second direction. The tape package further includes a second lead line including a first end electrically connected to the driving circuit and a second end extending in the second direction. The protrusion extends from the first main-connection portion, the first sub-connection portion, the body portion, the second sub-connection portion and the second main-connection portion in the third direction, and the protrusion has a curved shape.

According to example embodiments, a display panel module includes a display panel displaying an image, a driving part driving the display panel and a tape package. The tape package includes a body portion, a driving circuit, a first sub-connection portion, a first main-connection portion, a second sub-connection portion, a second main-connection portion, a first lead line, a second lead line, and a protrusion. The body portion includes flexible material. The driving circuit is disposed on the body portion. The first sub-connection portion extends from the body portion in a first direction and partially overlaps the display panel. The first main-connection portion extends from the first sub-connection portion in the first direction and overlaps the display panel. The second sub-connection portion extends from the body portion in a second direction opposite to the first direction and partially overlaps the driving part. The second main-connection portion extends from the second sub-connection portion in the second direction and overlaps the driving part. The first lead line electrically connects to the display panel and includes a first end electrically connected to the driving circuit and a second end extending in the first direction. The second lead line electrically connects to the driving part and includes a first end electrically connected to the driving circuit and a second end extending in the second direction. The protrusion extends from the first sub-connection portion in a third direction perpendicular to the first direction on a same plane with the first sub-connection portion.

In example embodiments, the protrusion has a rectangle shape.

In example embodiments, the protrusion has a curved shape.

In example embodiments, the protrusion extends from the first main-connection portion and the first sub-connection portion in the third direction, and the protrusion has a curved shape.

In example embodiments, the protrusion extends from the first main-connection portion, the first sub-connection portion, the body portion, the second sub-connection portion and the second main-connection portion in the third direction, and the protrusion has a curved shape.

In example embodiments, the tape package further includes a metallic support layer on the protrusion.

In example embodiments, the metallic support layer includes a same material with the first lead line.

In example embodiments, the display panel is a display panel including a liquid crystal layer.

In example embodiments, the display panel is a display panel including an organic light emitting diode.

According to the tape package and the display panel module having the tape package, a crack of the lead line may be reduced or effectively prevented.

BRIEF DESCRIPTION OF THE DRAWINGS

The above and other features and advantages of the inventive concept will become more apparent by describing in detailed exemplary embodiments thereof with reference to the accompanying drawings, in which.

DETAILED DESCRIPTION

Hereinafter, embodiments will be explained in detail with reference to the accompanying drawings.

Figure 1:
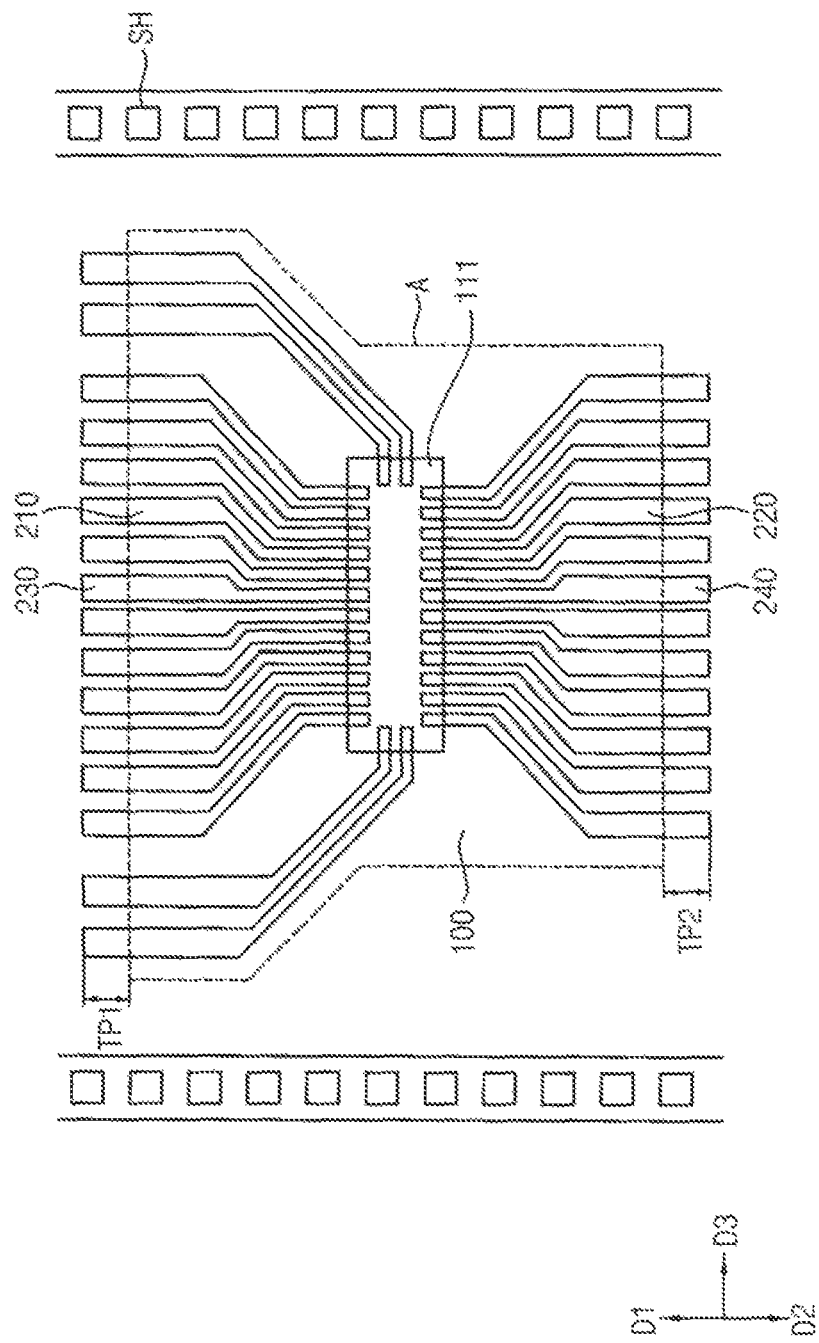
FIG. 1 is a plan view illustrating a base film used to manufacture a base substrate of a tape package in accordance with example embodiments.

FIG. 1 is a plan view illustrating a base film used to manufacture a base substrate of a tape package in accordance with example embodiments.

Figure 3:
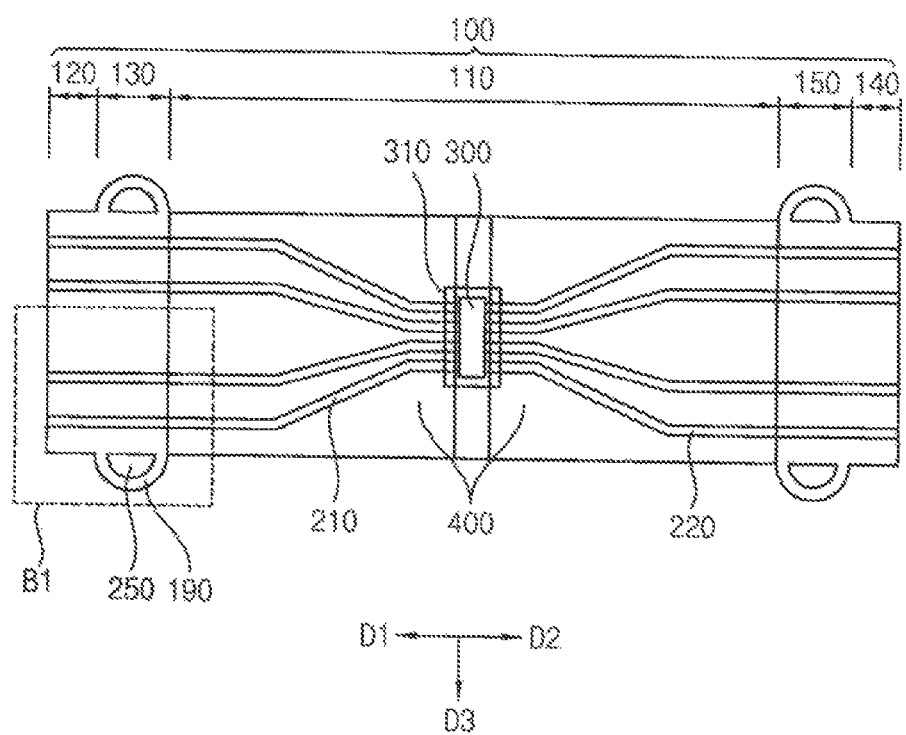
FIG. 3 is a plan view illustrating a tape package in accordance with an example embodiment.

Referring to FIG. 1, a tape package is shown in a state before being assembled with a driving circuit 300, a sealing material 310 and a protection layer 400 according to the exemplary embodiment illustrated in FIG. 3. The tape package includes a base substrate 100, driving circuit area 111 and a circuit pattern. The circuit pattern may include a first lead line 210, a second lead line 220, a first test pad 230 and a second test pad 240.

The base substrate 100 may include a material having relatively high flexibility. In one embodiment, for example, the base substrate 100 may include polyimide, epoxy resin, or similar materials. A portion of 'A' indicated by a dotted line on the base substrate 100 may define a single tape package. The portion of 'A' may have a polygonal shape according to the exemplary embodiment illustrated in FIG. 3. For example, the portion of 'A' may have a rectangle shape.

The base substrate 100 may include a plurality of sprocket holes SH formed on the base substrate 100 to make a manufacturing process easier.

The driving circuit area 111 may be defined in the portion of 'A' of the base substrate 100. A driving circuit may be disposed on the driving circuit area 111.

The first lead line 210 may be disposed on the portion of 'A' of the base substrate 100. The first lead line 210 may extend from the driving circuit area 111 in a first direction D1. The first lead line 210 may be electrically connected to the driving circuit.

The first test pad 230 may extend from the driving circuit area 111 in the first direction D1. The first test pad 230 may be disposed on a first external area TP1. The first external area TP1 is adjacent to the portion of 'A' in the first direction D1. The first test pad 230 may be electrically connected to the first lead line 210.

The second test pad 240 may extend from the driving circuit area 111 in a second direction D2. The second test pad 240 may be disposed on a second external area TP2. The second external area TP2 is adjacent to the portion of 'A' in the second direction D2. The second test pad 240 may be electrically connected to the second lead line 220.

The first test pad 230 and the second test pad 240 are configured for testing a function of the tape package before cutting the portion of 'A' of the tape package. After testing the function of the tape package using the first test pad 230 and the second test pad 240, the first area TP1 and the second area TP2 are cut or removed from a remaining portion of the tape package, to form the tape package in the portion of 'A'.

The first lead line 210 may be electrically connected to a display panel of a display apparatus. The second lead line 220 may be electrically connected to a driving part of the display apparatus.

Figure 2:
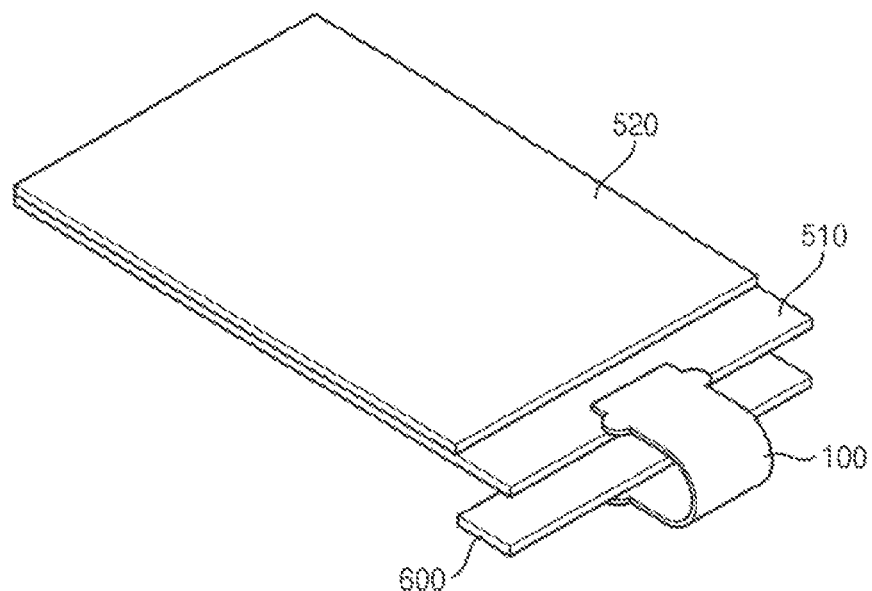
FIG. 2 is a perspective view illustrating a display panel module having a tape package in accordance with example embodiments.

FIG. 2 is a perspective view illustrating a display panel module having a tape package in accordance with example embodiments.

Referring to FIG. 2, a display panel module includes a display panel, a driving part and a tape package.

The display panel may include a first substrate 510, a second substrate 520 and a liquid crystal layer (not shown). For example, the first substrate 510 may be a thin film transistor substrate including a thin film transistor array. The first substrate 510 may include a first base substrate, thin film transistor and a pixel electrode. The second substrate 520 may face the first substrate 510 and may include a second base substrate, a color filter and a common electrode. The liquid crystal layer may be interposed between the first substrate 510 and the second substrate 520. An alignment of a liquid crystal molecule of the liquid crystal layer may be controlled by an electric field generated between the pixel electrode of the first substrate 510 and the common electrode of the second substrate 520. The display panel may display an image using light exiting from a backlight assembly. The display panel may expose a portion of the first substrate 510, so that the tape package may be electrically connected to the exposed portion of the first substrate 510.

The display panel may be a liquid crystal display panel including a liquid crystal layer. Alternatively, the display panel may be an organic light emitting display panel including an organic light emitting diode.

The driving part drives the display panel. The driving part may include an external substrate 600. The driving part may be electrically connected to the display panel through the tape package. The driving part may be disposed under the display panel.

Figure 4:
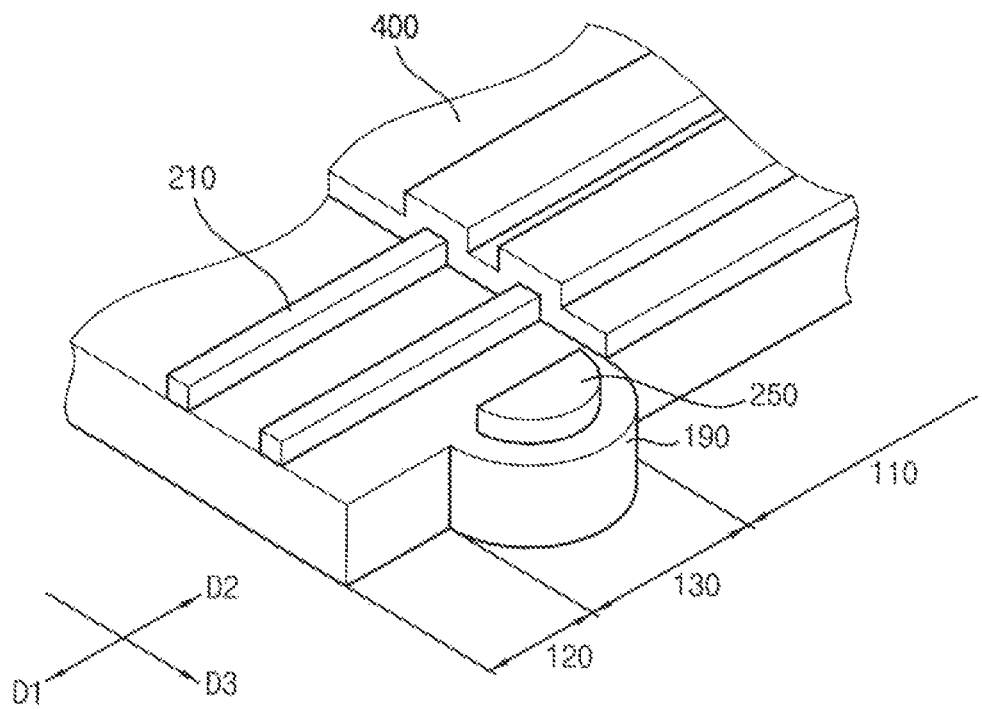
FIG. 4 is an enlarged perspective view illustrating a portion of 131' in FIG. 3.
Figure 5:
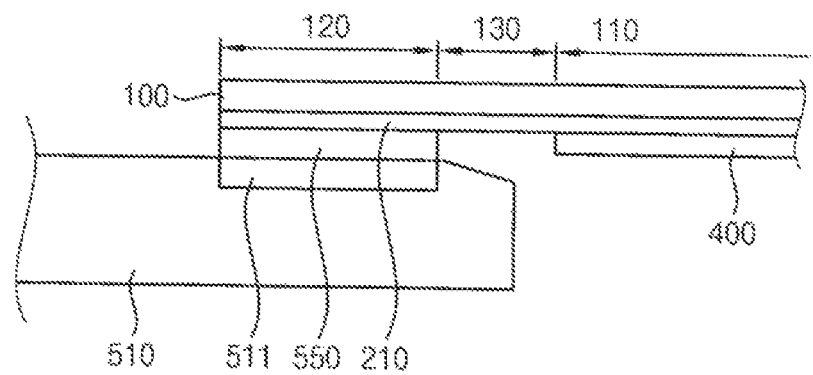
FIG. 5 is a cross-sectional view illustrating a display panel module in accordance with an example embodiment.

FIG. 3 is a plan view illustrating a tape package in accordance with an example embodiment. FIG. 4 is an enlarged perspective view illustrating a portion of 'B1' in FIG. 3. FIG. 5 is a cross-sectional view illustrating a display panel module in accordance with an example embodiment.

Referring to FIGS. 2, 3, 4, and 5, the tape package includes a base substrate 100, a first lead line 210, a second lead line 220, a driving circuit 300, a support layer 250, a protection layer 400 and a sealing material 310.

The base substrate 100 may include a body portion 110, a first sub-connection portion 130, a first main-connection portion 120, a second sub-connection portion 150, a second main-connection portion 140 and a protrusion 190.

The body portion 110 may include a material having relatively high flexibility. In one exemplary embodiment, for example, the body portion 110 may include polyimide and/or epoxy resin.

The first sub-connection portion 130 may extend from the body portion 110 in the first direction D1.

The first main-connection portion 120 may extend from the first sub-connection portion 130 in the first direction D1. The first main-connection portion 120 may be overlapped with the first substrate 510. For example, the first substrate 510 may include a first substrate pad 511. The first substrate pad 511 may be electrically connected to the first main-connection portion 120. The first main-connection portion 120 may be disposed on the first substrate pad 511. Thus, the first main-connection portion 120 may be electrically connected to the first substrate 510. The first main-connection portion 120 may be electrically connected to the first substrate pad 511 by an anisotropic conductive film 550.

The corners of the first main-connection portion 120 may have a rectangle shape. Alternatively, the corners of the first main-connection portion 120 may have a curved shape.

The first substrate 510 may be a thin film transistor substrate including a thin film transistor array.

The first sub-connection portion 130 may be partially overlapped with the first substrate 510. A portion of the first sub-connection portion 130 overlapped with the first substrate 510 may be disposed on the first substrate 510. The anisotropic conductive film 550 may not be disposed between the first substrate 510 and the portion of the first sub-connection portion 130 overlapped with the first substrate 510.

The second sub-connection portion 150 may extend from the body portion 110 in the second direction D2.

The second main-connection portion 140 may extend from the second sub-connection portion 150 in the second direction D2. The second main-connection portion 140 may be overlapped with the external substrate 600. For example, the external substrate 600 may include a second substrate pad. The second substrate pad may be electrically connected to the second main-connection portion 140. The second main-connection portion 140 may be disposed on the second substrate pad. Thus, the second main-connection portion 140 may be electrically connected to the external substrate 600. The second main-connection portion 140 may be electrically connected to the second substrate pad by an anisotropic conductive film 550.

The corners of the second main-connection portion 140 may have a rectangle shape. Alternatively, the corners of the second main-connection portion 140 may have a curved shape.

The second sub-connection portion 150 may be partially overlapped with the external substrate 600. A portion of the second sub-connection portion 150, overlapped with the external substrate 600, may be disposed on the external substrate 600. The anisotropic conductive film 550 may not be disposed between the external substrate 600 and the portion of the second sub-connection portion 150 overlapped with the first substrate 510.

The first sub-connection portion 130 and the second sub-connection portion 150 are portions that receive the most stress due to bending by an external force and a shearing stress.

The protrusion 190 may extend from the first sub-connection portion 130 in a third direction D3. The protrusion 190 may extend from the first sub-connection portion 130 in a fourth direction opposite to the third direction D3. The protrusion 190 may extend from the second sub-connection portion 150 in the third direction D3. The protrusion 190 may extend from the second sub-connection portion 150 in the fourth direction.

The protrusion 190 may have a curved shape.

Referring FIG. 5, the first sub-connection portion 130 may be partially overlapped with the first substrate 510. Thus, the protrusion 190 extending from the first sub-connection portion 130 may be partially overlapped with the first substrate 510. The second sub-connection portion 150 may be partially overlapped with the external substrate 600. Thus, the protrusion 190 extending from the second sub-connection portion 150 may be partially overlapped with the external substrate 600.

The protrusion 190, the first sub-connection portion 130 and the second sub-connection portion 150 may be formed from a same base substrate.

The protrusion 190 may be bent with the first sub-connection portion 130 and the second sub-connection portion 150 to relieve or reduce the stress of the first sub-connection portion 130 and the second sub-connection portion 150.

The first sub-connection portion 130, the first main-connection portion 120, the second sub-connection portion 150, the second main-connection portion 140 and the protrusion 190 may include a same material with the body portion 110.

The driving circuit 300 may be disposed on the body portion 110. The driving circuit 300 may include a plurality of terminals disposed on a lower surface of the driving circuit 300. The driving circuit 300 may be electrically connected to the first lead line 210 and the second lead line 220 by the terminals.

The first lead line 210 may be disposed on the base substrate 100. The first lead line 210 may extend from the driving circuit 300 in the first direction D1. A first end in the second direction D2 of the first lead line 210 may be electrically connected to the driving circuit 300. The tape package may further include a plurality of the first lead lines 210.

A width of the driving circuit 300 in the third direction D3 may be less than a width of the base substrate 100 in the third direction D3. Thus, intervals between the first lead lines 210 may be wider toward the first direction D1, and may be narrower toward the driving circuit 300.

The first lead line 210 may be electrically connected to the first substrate 510.

The first lead line 210 may include a first main-lead line and a first sub-lead line. The first main-lead line may be disposed on the first main-connection portion 120. The first sub-lead line may be disposed on the first sub-connection portion 130.

A width of the first sub-lead line in the third direction D3 may be substantially the same as a width of the first main-lead line in the third direction D3. Alternatively, the width of the first sub-lead line in the third direction D3 may be greater than the width of the first main-lead line in the third direction D3.

The second lead line 220 may be disposed on the base substrate 100. The second lead line 220 may extend from the driving circuit 300 in the second direction D2. A first end in the first direction D1 of the second lead line 220 may be electrically connected to the driving circuit 300. The tape package may further include a plurality of the second lead lines 220.

The width of the driving circuit 300 in the third direction D3 may be less than the width of the base substrate 100 in the third direction D3. Thus, intervals between the second lead lines 220 may be wider toward the second direction D2, and may be narrower toward the driving circuit 300.

The second lead line 220 may be electrically connected to the external substrate 600.

The second lead line 220 may include a second main-lead line and a second sub-lead line. The second main-lead line may be disposed on the second main-connection portion 140. The second sub-lead line may be disposed on the second sub-connection portion 150.

A width of the second sub-lead line in the third direction D3 may be substantially the same as a width of the second main-lead line in the third direction D3. Alternatively, the width of the second sub-lead line in the third direction D3 may be greater than the width of the second main-lead line in the third direction D3.

The first lead line 210 may further include a first branch line. The second lead line 220 may further include a second branch line. The first branch line and the second branch line are adjacent to the driving circuit 300. The first lead line 210 may further include a plurality of the first branch lines. The second lead line 220 may further include a plurality of the second branch lines.

A group of the terminals among the terminals of the driving circuit 300 to which the same signal is applied, may be respectively connected to the first branch lines from a single first lead line 210 or the second branch lines from a single second lead line 220.

The support layer 250 may be disposed on the protrusion 190. An area of the support layer 250 may be smaller than an area of the protrusion 190.

The support layer 250 may reduce the stress exerted on the protrusion 190 when the protrusion 190 is bent. The support layer 250 may include a same material as the first lead line 210 and the second lead line 220. The support layer 250, the first lead line 210 and the second lead line 220 may be formed from a same layer. A shape of the support layer 250 may be similar to the protrusion 190. For example, the support layer 250 may have a curved shape.

The protection layer 400 may be disposed on the first lead line 210 and the second lead line 220. The protection layer 400 may cover and insulate a circuit pattern including the first lead line 210 and the second lead line 220. The protection layer 400 may expose a portion of the first lead line 210 and a portion of the second lead line 220. For example, the protection layer 400 may be disposed on the body portion 110 and expose the driving circuit 300, the first main-connection portion 120, the first sub-connection portion 130, the second main-connection portion 140 and the second sub-connection portion 150. Alternatively, the protection layer 400 may be disposed on the body portion 110, the first sub-connection portion 130, the second sub-connection portion 150, the protrusion 190 and the support layer 250 and expose the driving circuit 300, the first main-connection portion 120 and the second main-connection portion 140. In one embodiment, the protection layer 400 may partially expose the first sub-connection portion 130, the second sub-connection portion 150, the protrusion 190 and the support layer 250. The protection layer 400 may include a solder resist, but is not limited thereto or thereby.

The sealing material 310 may surround the driving circuit 300 to secure the driving circuit 300 on the body portion 110. The sealing material 310 may cover a side surface of the driving circuit 310, a portion of the first lead line 210, a portion of the second lead line 220 and a portion of the protection layer 400. The sealing material 310 may include epoxy resin, but is not limited thereto or thereby.

Figure 6:
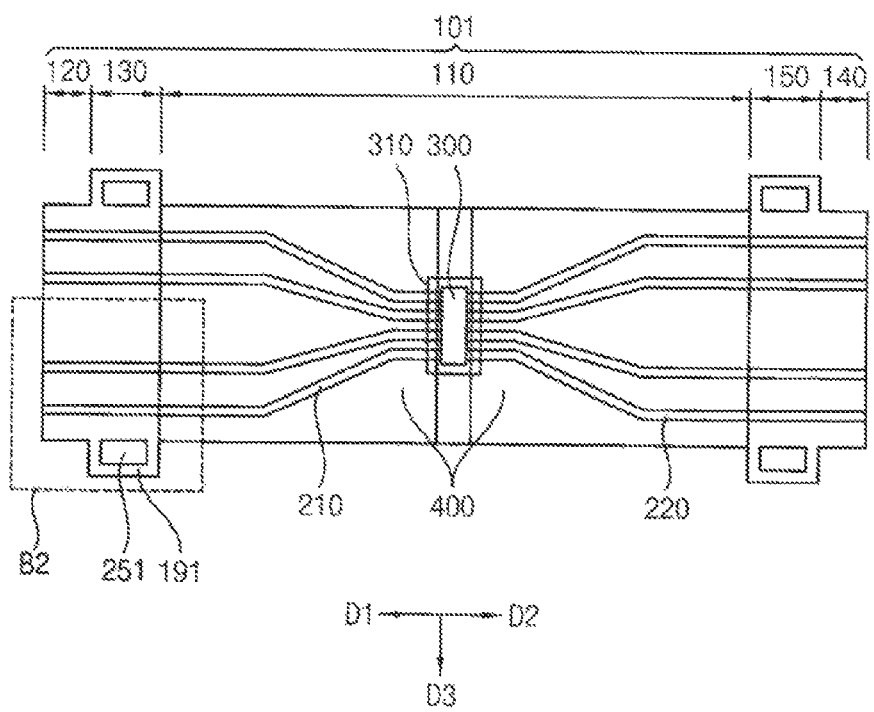
FIG. 6 is a plan view illustrating a tape package in accordance with an example embodiment.
Figure 7:
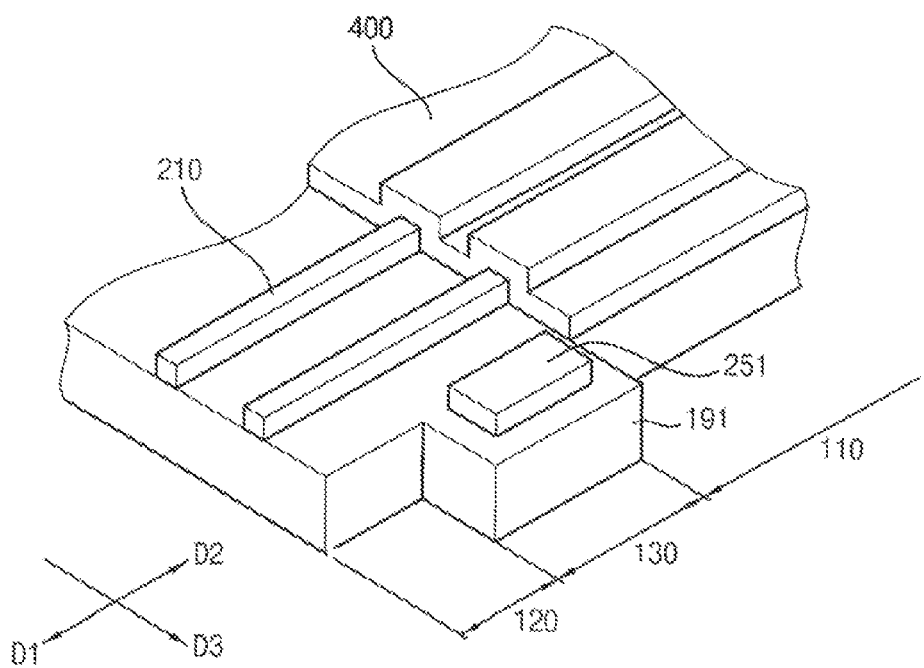
FIG. 7 is an enlarged perspective view illustrating a portion of 132' in FIG. 6.

FIG. 6 is a plan view illustrating a tape package in accordance with an example embodiment. FIG. 7 is an enlarged perspective view illustrating a portion of 132' in FIG. 6.

The display panel module according to the present example embodiment is substantially the same as the display panel module in FIG. 2 except for a tape package. Further, the tape package according to the present example embodiment is substantially the same as the tape package in FIGS. 3 to 5 except for a base substrate 101, a protrusion 191 and a support layer 251. Thus, the same reference numerals will be used to refer to same or like parts as those described in with reference to FIGS. 2 to 5 and any further repetitive explanation concerning the above elements will be omitted.

Referring to FIGS. 2, 6 and 7, the tape package includes a base substrate 101, a first lead line 210, a second lead line 220, a driving circuit 300, a support layer 251, a protection layer 400 and a sealing material 310.

The base substrate 101 may include a body portion 110, a first sub-connection portion 130, a first main-connection portion 120, a second sub-connection portion 150, a second main-connection portion 140 and a protrusion 191.

The body portion 110 may include a material having relatively high flexibility. In one exemplary embodiment, for example, the body portion 110 may include polyimide and/or epoxy resin.

The first sub-connection portion 130 may extend from the body portion 110 in the first direction D1.

The first main-connection portion 120 may extend from the first sub-connection portion 130 in the first direction D1. The first main-connection portion 120 may be overlapped with the first substrate 510. For example, the first substrate 510 may include a first substrate pad 511. The first substrate pad 511 may be electrically connected to the first main-connection portion 120. The first main-connection portion 120 may be disposed on the first substrate pad 511. Thus, the first main-connection portion 120 may be electrically connected to the first substrate 510. The first main-connection portion 120 may be electrically connected to the first substrate pad 511 by an anisotropic conductive film 550.

The corners of the first main-connection portion 120 may have a rectangle shape. Alternatively, the corners of the first main-connection portion 120 may have a curved shape.

The first substrate 510 may be a thin film transistor substrate including a thin film transistor array.

The first sub-connection portion 130 may be partially overlapped with the first substrate 510. A portion of the first sub-connection portion 130 overlapped with the first substrate 510 may be disposed on the first substrate 510. The anisotropic conductive film 550 may not be disposed between the first substrate 510 and the portion of the first sub-connection portion 130 overlapped with the first substrate 510.

The second sub-connection portion 150 may extend from the body portion 110 in the second direction D2.

The second main-connection portion 140 may extend from the second sub-connection portion 150 in the second direction D2. The second main-connection portion 140 may be overlapped with the external substrate 600. For example, the external substrate 600 may include a second substrate pad. The second substrate pad may be electrically connected to the second main-connection portion 140. The second main-connection portion 140 may be disposed on the second substrate pad. Thus, the second main-connection portion 140 may be electrically connected to the external substrate 600. The second main-connection portion 140 may be electrically connected to the second substrate pad by an anisotropic conductive film 550.

The corners of the second main-connection portion 140 may have a rectangle shape. Alternatively, the corners of the second main-connection portion 140 may have a curved shape.

The second sub-connection portion 150 may be partially overlapped with the external substrate 600. A portion of the second sub-connection portion 150, overlapped with the external substrate 600, may be disposed on the external substrate 600. The anisotropic conductive film 550 may not be disposed between the external substrate 600 and the portion of the second sub-connection portion 150 overlapped with the first substrate 510.

The first sub-connection portion 130 and the second sub-connection portion 150 are portions that receive the most stress due to bending by an external force and a shearing stress.

The protrusion 191 may extend from the first sub-connection portion 130 in the third direction D3. The protrusion 191 may extend from the first sub-connection portion 130 in the fourth direction. The protrusion 191 may extend from the second sub-connection portion 150 in the third direction D3. The protrusion 191 may extend from the second sub-connection portion 150 in the fourth direction. The protrusion 191 may have a rectangle shape.

The first sub-connection portion 130 may be partially overlapped with the first substrate 510. Thus, the protrusion 191 extending from the first sub-connection portion 130 may be partially overlapped with the first substrate 510. The second sub-connection portion 150 may be partially overlapped with the external substrate 600. Thus, the protrusion 191 extending from the second sub-connection portion 150 may be partially overlapped with the external substrate 600.

The protrusion 191, the first sub-connection portion 130 and the second sub-connection portion 150 may be formed from a same base substrate.

The protrusion 191 may be bent with the first sub-connection portion 130 and the second sub-connection portion 150. Thus, the stress of the first sub-connection portion 130 and the second sub-connection portion 150 may be dissipated.

The first sub-connection portion 130, the first main-connection portion 120, the second sub-connection portion 150, the second main-connection portion 140 and the protrusion 191 may include a same material with the body portion 110.

The support layer 251 may be disposed on the protrusion 191. An area of the support layer 251 may be smaller than an area of the protrusion 191.

The support layer 251 may reduce the stress exerted on the protrusion 191 when the protrusion 191 is bent. The support layer 251 may include a same material as the first lead line 210 and the second lead line 220. The support layer 251, the first lead line 210 and the second lead line 220 may be formed from a same layer. A shape of the support layer 251 may be similar to the protrusion 191. For example, the support layer 251 may have a rectangle shape.

The protection layer 400 may be disposed on the first lead line 210 and the second lead line 220. The protection layer 400 may cover and insulate a circuit pattern including the first lead line 210 and the second lead line 220. The protection layer 400 may expose a portion of the first lead line 210 and a portion of the second lead line 220. For example, the protection layer 400 may be disposed on the body portion 110 and expose the driving circuit 300, the first main-connection portion 120, the first sub-connection portion 130, the second main-connection portion 140 and the second sub-connection portion 150. Alternatively, the protection layer 400 may be disposed on the body portion 110, the first sub-connection portion 130, the second sub-connection portion 150, the protrusion 191 and the support layer 251 and expose the driving circuit 300, the first main-connection portion 120 and the second main-connection portion 140. In one embodiment, the protection layer 400 may partially expose the first sub-connection portion 130, the second sub-connection portion 150, the protrusion 191 and the support layer 251. The protection layer 400 may include a solder resist, but is not limited thereto or thereby.

Figure 8:
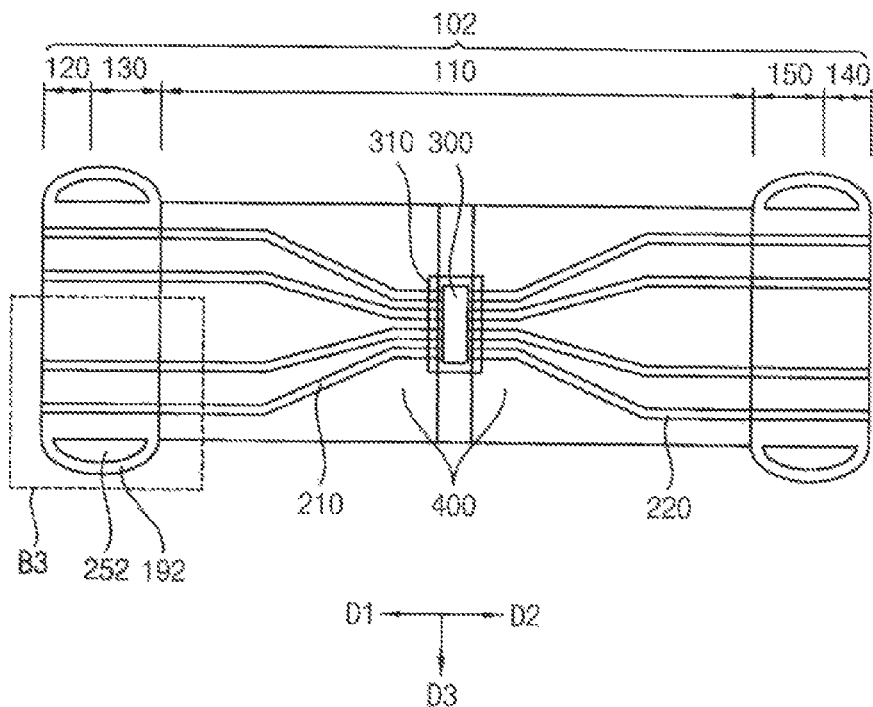
FIG. 8 is a plan view illustrating a tape package in accordance with an example embodiment.
Figure 9:
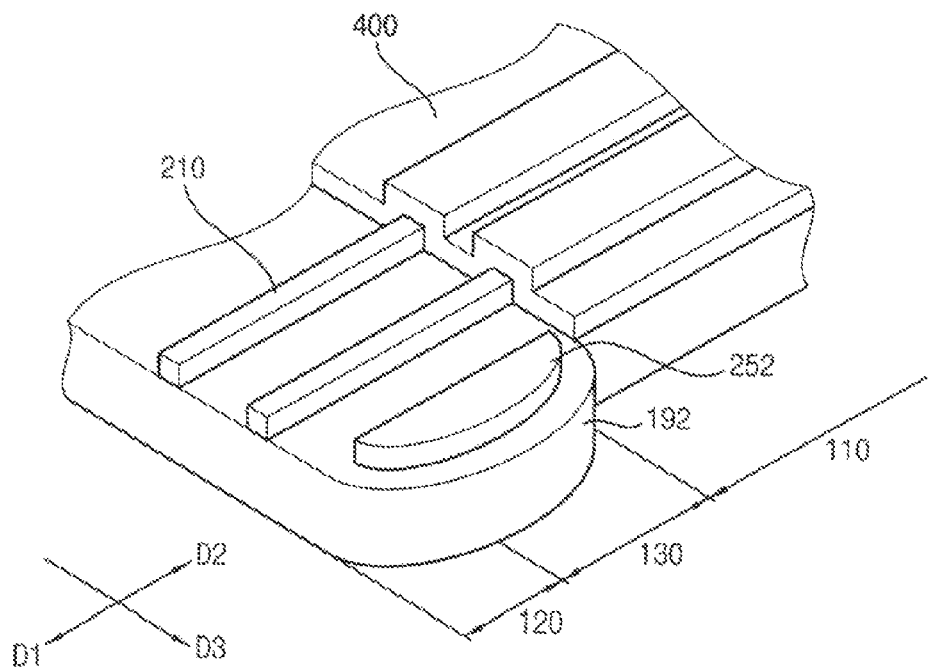
FIG. 9 is an enlarged perspective view illustrating a portion of 133' in FIG. 8.

FIG. 8 is a plan view illustrating a tape package in accordance with an example embodiment. FIG. 9 is an enlarged perspective view illustrating a portion of 133' in FIG. 8.

The display panel module according to the present example embodiment is substantially the same as the display panel module in FIG. 2 except for a tape package. Further, the tape package according to the present example embodiment is substantially the same as the tape package in FIGS. 3 to 5 except for a base substrate 102, a protrusion 192 and a support layer 252. Thus, the same reference numerals will be used to refer to same or like parts as those described in with reference to FIGS. 2 to 5 and any further repetitive explanation concerning the above elements will be omitted.

Referring to FIGS. 2, 8 and 9, the tape package includes a base substrate 102, a first lead line 210, a second lead line 220, a driving circuit 300, a support layer 252, a protection layer 400 and a sealing material 310.

The base substrate 102 may include a body portion 110, a first sub-connection portion 130, a first main-connection portion 120, a second sub-connection portion 150, a second main-connection portion 140 and a protrusion 192.

The body portion 110 may include a material having relatively high flexibility. In one exemplary embodiment, for example, the body portion 110 may include polyimide and/or epoxy resin.

The first sub-connection portion 130 may extend from the body portion 110 in the first direction D1.

The first main-connection portion 120 may extend from the first sub-connection portion 130 in the first direction D1. The first main-connection portion 120 may be overlapped with the first substrate 510. For example, the first substrate 510 may include a first substrate pad 511. The first substrate pad 511 may be electrically connected to the first main-connection portion 120. The first main-connection portion 120 may be disposed on the first substrate pad 511. Thus, the first main-connection portion 120 may be electrically connected to the first substrate 510. The first main-connection portion 120 may be electrically connected to the first substrate pad 511 by an anisotropic conductive film 550.

The corners of the first main-connection portion 120 may have a rectangle shape. Alternatively, the corners of the first main-connection portion 120 may have a curved shape.

The first substrate 510 may be a thin film transistor substrate including a thin film transistor array.

The first sub-connection portion 130 may be partially overlapped with the first substrate 510. A portion of the first sub-connection portion 130 overlapped with the first substrate 510 may be disposed on the first substrate 510. The anisotropic conductive film 550 may not be disposed between the first substrate 510 and the portion of the first sub-connection portion 130 overlapped with the first substrate 510.

The second sub-connection portion 150 may extend from the body portion 110 in the second direction D2.

The second main-connection portion 140 may extend from the second sub-connection portion 150 in the second direction D2. The second main-connection portion 140 may be overlapped with the external substrate 600. For example, the external substrate 600 may include a second substrate pad. The second substrate pad may be electrically connected to the second main-connection portion 140. The second main-connection portion 140 may be disposed on the second substrate pad. Thus, the second main-connection portion 140 may be electrically connected to the external substrate 600. The second main-connection portion 140 may be electrically connected to the second substrate pad by an anisotropic conductive film 550.

The corners of the second main-connection portion 140 may have a rectangle shape. Alternatively, the corners of the second main-connection portion 140 may have a curved shape.

The second sub-connection portion 150 may be partially overlapped with the external substrate 600. A portion of the second sub-connection portion 150, overlapped with the external substrate 600, may be disposed on the external substrate 600. The anisotropic conductive film 550 may not be disposed between the external substrate 600 and the portion of the second sub-connection portion 150 overlapped with the first substrate 510.

The first sub-connection portion 130 and the second sub-connection portion 150 are portions that receive the most stress due to bending by an external force and a shearing stress.

The protrusion 192 may extend from the first main-connection portion 120 and the first sub-connection portion 130 in the third direction D3. The protrusion 192 may extend from the first main-connection portion 120 and the first sub-connection portion 130 in the fourth direction. The protrusion 192 may extend from the second main-connection portion 140 and the second sub-connection portion 150 in the third direction D3. The protrusion 192 may extend from the second main-connection portion 140 and the second sub-connection portion 150 in the fourth direction. The protrusion 192 may have a curved shape.

The first sub-connection portion 130 may be partially overlapped with the first substrate 510. Thus, the protrusion 192 extending from the first main-connection portion 120 and the first sub-connection portion 130 may be partially overlapped with the first substrate 510. The second sub-connection portion 150 may be partially overlapped with the external substrate 600. Thus, the protrusion 192 extending from the second main-connection portion 140 and the second sub-connection portion 150 may be partially overlapped with the external substrate 600.

The protrusion 192, the first main-connection portion 120, the first sub-connection portion 130, the second main-connection portion 140 and the second sub-connection portion 150 may be formed from a same base substrate.

The protrusion 192 may be bent with the first sub-connection portion 130 and the second sub-connection portion 150. Thus, the stress of the first sub-connection portion 130 and the second sub-connection portion 150 may be dissipated.

The first sub-connection portion 130, the first main-connection portion 120, the second sub-connection portion 150, the second main-connection portion 140 and the protrusion 192 may include a same material with the body portion 110.

The support layer 252 may be disposed on the protrusion 192. An area of the support layer 252 may be smaller than an area of the protrusion 192.

The support layer 252 may reduce the stress exerted on the protrusion 192 while the protrusion 192 is bent. The support layer 252 may include a same material as the first lead line 210 and the second lead line 220. The support layer 252, the first lead line 210 and the second lead line 220 may be formed from a same layer. A shape of the support layer 252 may be similar to the protrusion 192. For example, the support layer 252 may have a curved shape.

The protection layer 400 may be disposed on the first lead line 210 and the second lead line 220. The protection layer 400 may cover and insulate a circuit pattern including the first lead line 210 and the second lead line 220. The protection layer 400 may expose a portion of the first lead line 210 and a portion of the second lead line 220. For example, the protection layer 400 may be disposed on the body portion 110 and expose the driving circuit 300, the first main-connection portion 120, the first sub-connection portion 130, the second main-connection portion 140 and the second sub-connection portion 150. Alternatively, the protection layer 400 may be disposed on the body portion 110, the first sub-connection portion 130, the second sub-connection portion 150, the protrusion 192 and the support layer 252 and expose the driving circuit 300, the first main-connection portion 120 and the second main-connection portion 140. In one embodiment, the protection layer 400 may partially expose the first sub-connection portion 130, the second sub-connection portion 150, the protrusion 192 and the support layer 252. The protection layer 400 may include a solder resist, but is not limited thereto or thereby.

Figure 10:
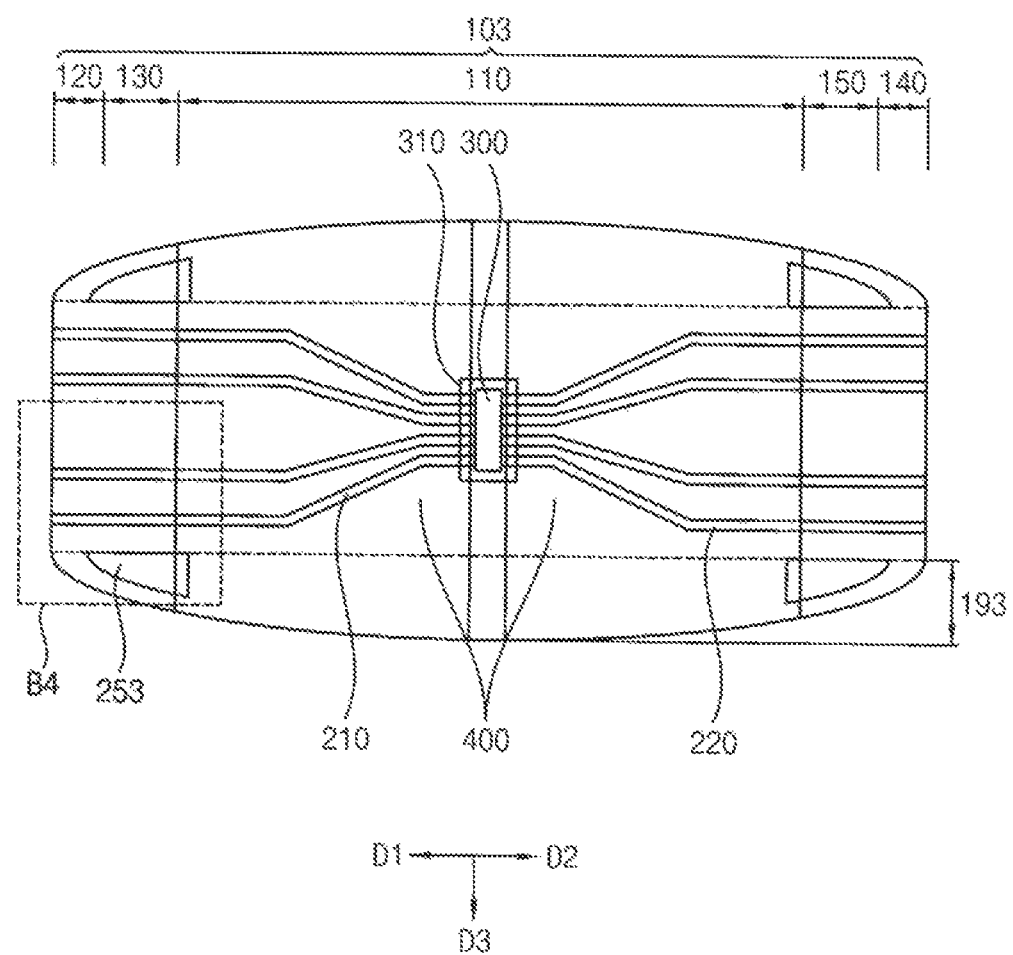
FIG. 10 is a plan view illustrating a tape package in accordance with an example embodiment.
Figure 11:
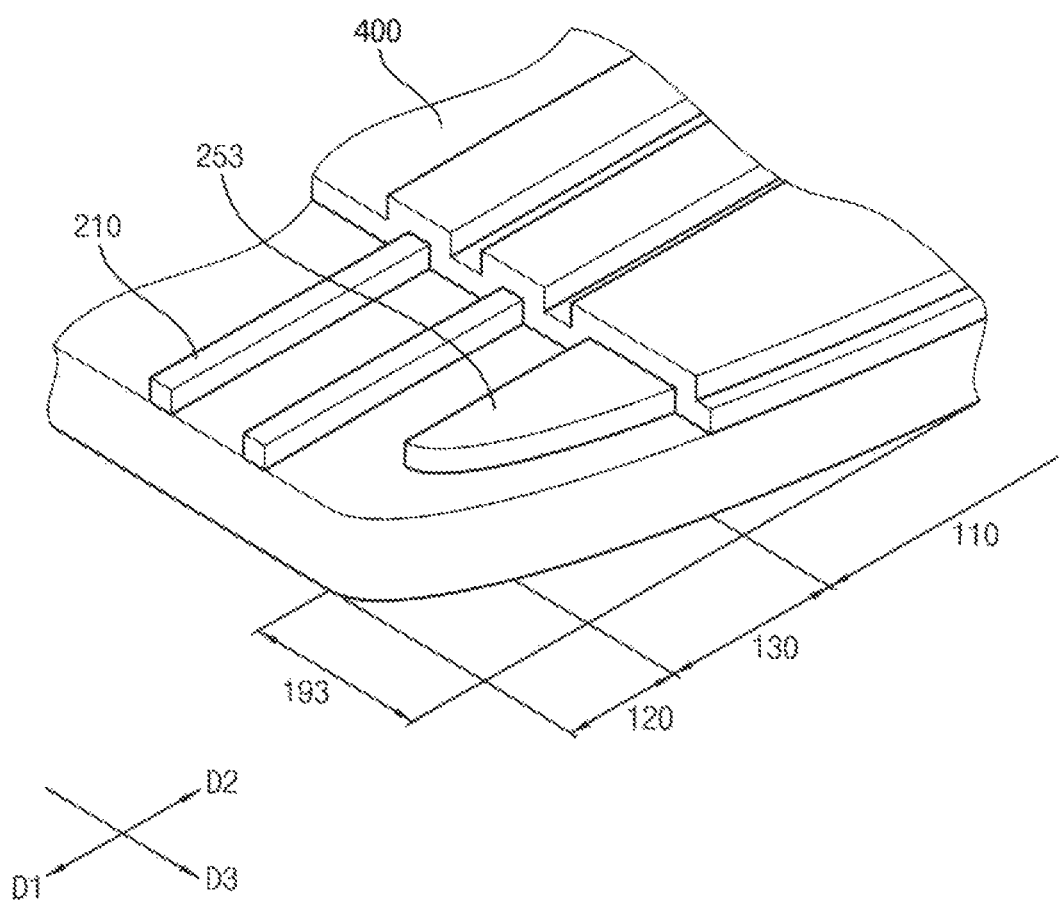
FIG. 11 is an enlarged perspective view illustrating a portion of 134' in FIG. 10.

FIG. 10 is a plan view illustrating a tape package in accordance with an example embodiment. FIG. 11 is an enlarged perspective view illustrating a portion of 134' in FIG. 10.

The display panel module according to the present example embodiment is substantially the same as the display panel module in FIG. 2 except for a tape package. Further, the tape package according to the present example embodiment is substantially the same as the tape package in FIGS. 3 to 5 except for a base substrate 103, a protrusion 193 and a support layer 253. Thus, the same reference numerals will be used to refer to same or like parts as those described in with reference to FIGS. 2 to 5 and any further repetitive explanation concerning the above elements will be omitted.

Referring to FIGS. 2, 10 and 11, the tape package includes a base substrate 103, a first lead line 210, a second lead line 220, a driving circuit 300, a support layer 253, a protection layer 400 and a sealing material 310.

The base substrate 103 may include a body portion 110, a first sub-connection portion 130, a first main-connection portion 120, a second sub-connection portion 150, a second main-connection portion 140 and a protrusion 193.

The body portion 110 may include a material having relatively high flexibility. In one exemplary embodiment, for example, the body portion 110 may include polyimide and/or epoxy resin.

The first sub-connection portion 130 may extend from the body portion 110 in the first direction D1.

The first main-connection portion 120 may extend from the first sub-connection portion 130 in the first direction D1. The first main-connection portion 120 may be overlapped with the first substrate 510. For example, the first substrate 510 may include a first substrate pad 511. The first substrate pad 511 may be electrically connected to the first main-connection portion 120. The first main-connection portion 120 may be disposed on the first substrate pad 511. Thus, the first main-connection portion 120 may be electrically connected to the first substrate 510. The first main-connection portion 120 may be electrically connected to the first substrate pad 511 by an anisotropic conductive film 550.

The corners of the first main-connection portion 120 may have a rectangle shape. Alternatively, the corners of the first main-connection portion 120 may have a curved shape.

The first substrate 510 may be a thin film transistor substrate including a thin film transistor array.

The first sub-connection portion 130 may be partially overlapped with the first substrate 510. A portion of the first sub-connection portion 130 overlapped with the first substrate 510 may be disposed on the first substrate 510. The anisotropic conductive film 550 may not be disposed between the first substrate 510 and the portion of the first sub-connection portion 130 overlapped with the first substrate 510.

The second sub-connection portion 150 may extend from the body portion 110 in the second direction D2.

The second main-connection portion 140 may extend from the second sub-connection portion 150 in the second direction D2. The second main-connection portion 140 may be overlapped with the external substrate 600. For example, the external substrate 600 may include a second substrate pad. The second substrate pad may be electrically connected to the second main-connection portion 140. The second main-connection portion 140 may be disposed on the second substrate pad. Thus, the second main-connection portion 140 may be electrically connected to the external substrate 600. The second main-connection portion 140 may be electrically connected to the second substrate pad by an anisotropic conductive film 550.

The corners of the second main-connection portion 140 may have a rectangle shape. Alternatively, the corners of the second main-connection portion 140 may have a curved shape.

The second sub-connection portion 150 may be partially overlapped with the external substrate 600. A portion of the second sub-connection portion 150, overlapped with the external substrate 600, may be disposed on the external substrate 600. The anisotropic conductive film 550 may not be disposed between the external substrate 600 and the portion of the second sub-connection portion 150 overlapped with the first substrate 510.

The first sub-connection portion 130 and the second sub-connection portion 150 are portions that receive the most stress due to bending by an external force and a shearing stress.

The protrusion 193 may extend from the first main-connection portion 120, the first sub-connection portion 130, the body portion 110, the second sub-connection portion 150 and the second main-connection portion 140 in the third direction D3. The protrusion 193 may extend from the first main-connection portion 120, the first sub-connection portion 130, the body portion 110, the second sub-connection portion 150 and the second main-connection portion 140 in the fourth direction. The protrusion 193 may have a curved shape.

The first sub-connection portion 130 may be partially overlapped with the first substrate 510. Thus, the protrusion 193 extending from the first main-connection portion 120, the first sub-connection portion 130, the body portion 110, the second sub-connection portion 150 and the second main-connection portion 140 may be partially overlapped with the first substrate 510. The second sub-connection portion 150 may be partially overlapped with the external substrate 600. Thus, the protrusion 193 extending from the first main-connection portion 120, the first sub-connection portion 130, the body portion 110, the second sub-connection portion 150 and the second main-connection portion 140 may be partially overlapped with the external substrate 600.

The protrusion 193, the first main-connection portion 120, the first sub-connection portion 130, the body portion 110, the second main-connection portion 140 and the second sub-connection portion 150 may be formed from a same base substrate.

The protrusion 193 may be bent with the first sub-connection portion 130 and the second sub-connection portion 150. Thus, the stress of the first sub-connection portion 130 and the second sub-connection portion 150 may be dissipated.

The first sub-connection portion 130, the first main-connection portion 120, the second sub-connection portion 150, the second main-connection portion 140 and the protrusion 193 may include a same material with the body portion 110.

The support layer 253 may be disposed on the protrusion 193. An area of the support layer 253 may be smaller than an area of the protrusion 193.

The support layer 253 may reduce the stress exerted on the protrusion 193 when the protrusion 193 is bent. The support layer 253 may include a same material as the first lead line 210 and the second lead line 220. The support layer 253, the first lead line 210 and the second lead line 220 may be formed from a same layer. A shape of the support layer 253 may be similar to the protrusion 193. For example, the support layer 253 may have a curved shape.

The protection layer 400 may be disposed on the first lead line 210 and the second lead line 220. The protection layer 400 may cover and insulate a circuit pattern including the first lead line 210 and the second lead line 220. The protection layer 400 may expose a portion of the first lead line 210 and a portion of the second lead line 220. For example, the protection layer 400 may be disposed on the body portion 110, the protrusion 193 and the support layer 253, and expose the driving circuit 300, the first main-connection portion 120, the first sub-connection portion 130, the second main-connection portion 140 and the second sub-connection portion 150, and partially expose the protrusion 193 and the support layer 253. Alternatively, the protection layer 400 may be disposed on the body portion 110, the first sub-connection portion 130, the second sub-connection portion 150, the protrusion 193 and the support layer 253 and expose the driving circuit 300, the first main-connection portion 120 and the second main-connection portion 140. In one embodiment, the protection layer 400 may partially expose the first sub-connection portion 130, the second sub-connection portion 150, the protrusion 193 and the support layer 253. The protection layer 400 may include a solder resist, but is not limited thereto or thereby.

According to the present example embodiments, the base substrate of the tape package includes the protrusion and the support layer disposed on the protrusion. Even when the tape package is bent by an external force, the portion of the base substrate corresponding to the protrusion may be hardly bent because of the protrusion and the support layer. Thus, a crack of the lead line may be reduced or effectively prevented.

The foregoing is illustrative of the inventive concept and is not to be construed as limiting thereof. Although a few exemplary embodiments have been described, those skilled in the art will readily appreciate that many modifications are possible in the exemplary embodiments without materially departing from the novel teachings and advantages as set forth herein. Accordingly, all such modifications are intended to be included within the scope of the inventive concept. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the disclosure.

What is claimed is:

1. A tape package comprising:
a body portion comprising a flexible material;
a driving circuit disposed on the body portion;
a first sub-connection portion extending from the body portion in a first direction, a second direction being opposite the first direction;
a first main-connection portion extending from the first sub-connection portion in the first direction such that the first sub-connection portion is disposed between the body portion and the first main-connection portion; and
a first lead line including a first end electrically connected to the driving circuit and a second end extending in the first direction, the first end being opposite to the second end,
wherein the first sub-connection portion includes a protrusion extending therefrom in a third direction perpendicular to the first direction in a plan view so that a width of the first sub-connection portion including the protrusion in the third direction is greater than widths of the body portion and the first main-connection portion.

2. The tape package of claim 1, wherein the protrusion has a rectangle shape.

3. The tape package of claim 1, wherein the protrusion has a curved shape.

4. The tape package of claim 1, further comprising a metallic support layer on the protrusion.

5. The tape package of claim 4, wherein the metallic support layer comprises a material the same as a material of the first lead line.

6. The tape package of claim 1, further comprising a protection layer covering a portion of the first lead line.

7. The tape package of claim 1, further comprising a sealing material securing the driving circuit to the body portion and covering a side surface of the driving circuit.

8. The tape package of claim 1, wherein the first lead line comprises a first main-lead line disposed on the first main-connection portion and a first sub-lead line disposed on the first sub-connection portion,
wherein a width of the first sub-lead line in the third direction is greater than a width of the first main-lead line in the third direction.

9. The tape package of claim 1, wherein corners in the first direction of the first main-connection portion are curved.

10. The tape package of claim 1, wherein the protrusion extends from the first main-connection portion and the first sub-connection portion in the third direction, and the protrusion has a curved shape.

11. The tape package of claim 1, further comprising:
a second sub-connection portion extending from the body portion in the second direction;
a second main-connection portion extending from the second sub-connection portion in the second direction; and
a second lead line including a first end electrically connected to the driving circuit and a second end extending in the second direction,
wherein the protrusion extends from the first main-connection portion, the first sub-connection portion, the body portion, the second sub-connection portion and the second main-connection portion in the third direction, and the protrusion has a curved shape.

12. A display panel module comprising:
a display panel configured to display an image;
a driving part configured to drive the display panel; and
a tape package comprising:
a body portion comprising flexible material;
a driving circuit disposed on the body portion;
a first sub-connection portion extending from the body portion in a first direction and partially overlapped with the display panel;
a first main-connection portion extending from the first sub-connection portion in the first direction and overlapped with the display panel;
a second sub-connection portion extending from the body portion in a second direction opposite to the first direction and partially overlapped with the driving part;
a second main-connection portion extending from the second sub-connection portion in the second direction and overlapped with the driving part;
a first lead line electrically connected to the display panel and including a first end electrically connected to the driving circuit and a second end extending in the first direction;
a second lead line electrically connected to the driving part and including a first end electrically connected to the driving circuit and a second end extending in the second direction; and
a protrusion extending from the first sub-connection portion in a third direction perpendicular to the first direction on a same plane with the first sub-connection portion.

13. The display panel module of claim 12, wherein the protrusion has a rectangle shape.

14. The display panel module of claim 12, wherein the protrusion has a curved shape.

15. The display panel module of claim 12, wherein the protrusion extends from the first main-connection portion and the first sub-connection portion in the third direction, and the protrusion has a curved shape.

16. The display panel module of claim 12, wherein the protrusion extends from the first main-connection portion, the first sub-connection portion, the body portion, the second sub-connection portion and the second main-connection portion in the third direction, and the protrusion has a curved shape.

17. The display panel module of claim 12, wherein the tape package further comprises a metallic support layer on the protrusion.

18. The display panel module of claim 17, wherein the metallic support layer comprises a material the same as a material of the first lead line.

19. The display panel module of claim 12, wherein the display panel comprises a liquid crystal layer.

20. The display panel module of claim 12, wherein the display panel comprises an organic light emitting diode.

* * * * *